United States Patent
Pfaffinger et al.

(10) Patent No.: US 10,842,024 B2
(45) Date of Patent: Nov. 17, 2020

(54) METHOD AND SYSTEM FOR POPULATING PRINTED CIRCUIT BOARDS

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 259 days.

(21) Appl. No.: 15/542,974

(22) PCT Filed: Nov. 17, 2015

(86) PCT No.: PCT/EP2015/076795
§ 371 (c)(1),
(2) Date: Jul. 12, 2017

(87) PCT Pub. No.: WO2016/113020
PCT Pub. Date: Jul. 21, 2016

(65) Prior Publication Data
US 2018/0007794 A1    Jan. 4, 2018

(30) Foreign Application Priority Data
Jan. 14, 2015   (DE) .................. 10 2015 200 414

(51) Int. Cl.
*H05K 3/00* (2006.01)
*H05K 13/08* (2006.01)
*G05B 19/418* (2006.01)

(52) U.S. Cl.
CPC ..... *H05K 3/0005* (2013.01); *G05B 19/41865* (2013.01); *H05K 3/0097* (2013.01); *H05K 13/085* (2018.08)

(58) Field of Classification Search
CPC .............. H05K 13/085; H05K 13/0857; H05K 13/0061; H05K 13/0411; Y10T 29/53178;
(Continued)

(56) References Cited

U.S. PATENT DOCUMENTS

| 6,983,532 B2 * | 1/2006 | White | H05K 13/0857 29/740 |
| 7,032,304 B2 * | 4/2006 | Gieskes | H05K 13/0411 29/832 |

(Continued)

FOREIGN PATENT DOCUMENTS

| CN | 101854795 A | 10/2010 |
| CN | 102958343 A | 3/2013 |

(Continued)

OTHER PUBLICATIONS

International Search Report for PCT Application No. PCT/EP2015/076795, dated Mar. 1, 2016.

*Primary Examiner* — Darrin D Dunn
(74) *Attorney, Agent, or Firm* — Schmeiser, Olsen & Watts LLP

(57) ABSTRACT

Provided is a method for populating printed circuit boards, which includes the steps of registering jobs in each case relating to the population of a number of printed circuit boards of a printed circuit board type with components of predetermined component types, assigning printed circuit board types of the registered jobs to a predetermined number of fixed set-up families, optimizing the assignment in such a way that a characteristic number relating to all the pick-and-place lines of the pick-and-place system is optimized as far as possible, and populating the printed circuit boards on one of the pick-and-place lines by using one of the fixed set-ups.

5 Claims, 2 Drawing Sheets

Figure 1:
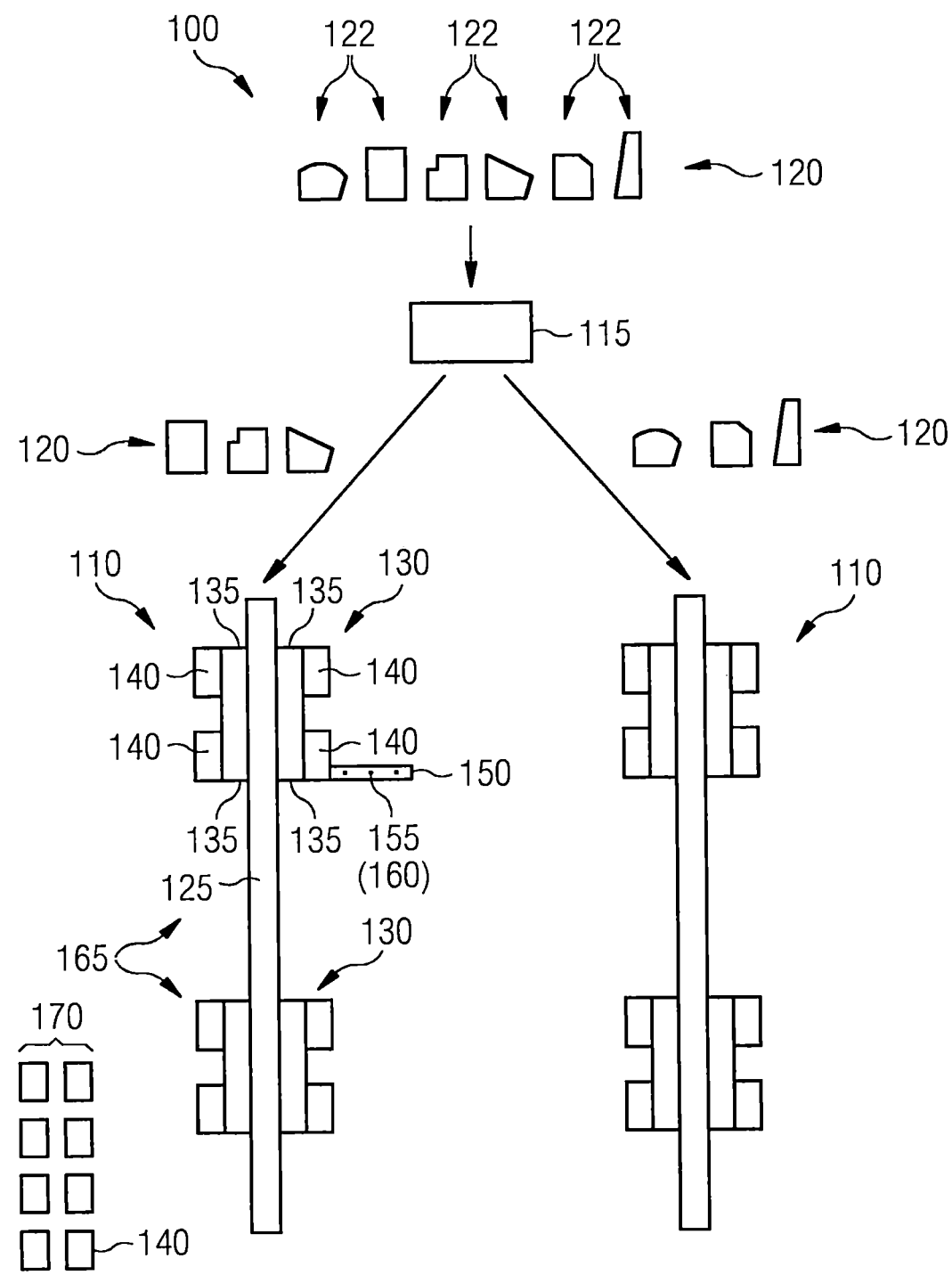

(58) Field of Classification Search
CPC .......... Y10T 29/4913; Y10T 29/53174; Y10T 29/5196; Y10T 29/49828; Y10T 29/5191; Y10T 29/53048; Y10T 29/53378
See application file for complete search history.

(56) References Cited

U.S. PATENT DOCUMENTS

| | | | | |
|---|---|---|---|---|
| 8,051,555 | B2* | 11/2011 | Kim | H01L 24/81 228/180.5 |
| 8,793,008 | B2* | 7/2014 | Bauer | H05K 13/085 700/111 |
| 9,888,620 | B2* | 2/2018 | Pfaffinger | H05K 13/08 |
| 9,955,620 | B2* | 4/2018 | Royer | H05K 13/08 |
| 9,974,220 | B2* | 5/2018 | Craiovan | H05K 13/08 |
| 10,117,370 | B2* | 10/2018 | Pfaffinger | H05K 13/08 |
| 2007/0006454 | A1* | 1/2007 | Onobori | H05K 13/0465 29/832 |
| 2007/0204086 | A1* | 8/2007 | Jaroszewski | H05K 13/085 710/262 |
| 2009/0024242 | A1* | 1/2009 | Mimura | H01L 21/67132 700/114 |
| 2012/0004762 | A1* | 1/2012 | Bauer | H05K 13/085 700/219 |
| 2012/0240388 | A1* | 9/2012 | Ishimoto | H05K 13/08 29/593 |
| 2014/0012992 | A1* | 1/2014 | Koka | H04L 47/70 709/226 |
| 2015/0195965 | A1* | 7/2015 | Craiovan | H05K 13/08 29/593 |
| 2018/0168080 | A1* | 6/2018 | Suzuki | H05K 13/08 |

FOREIGN PATENT DOCUMENTS

| | | | |
|---|---|---|---|
| DE | 10 2011 076565 A1 | 11/2012 | |
| DE | 102012220904 A1 | 5/2014 | |
| EP | 0478360 A1 | 4/1992 | |
| WO | 2014005744 A1 | 1/2014 | |
| WO | WO-2014075831 A1 * | 5/2014 | ............ H05K 13/08 |
| WO | WO-2014079600 A1 * | 5/2014 | ........... H05K 13/085 |

* cited by examiner

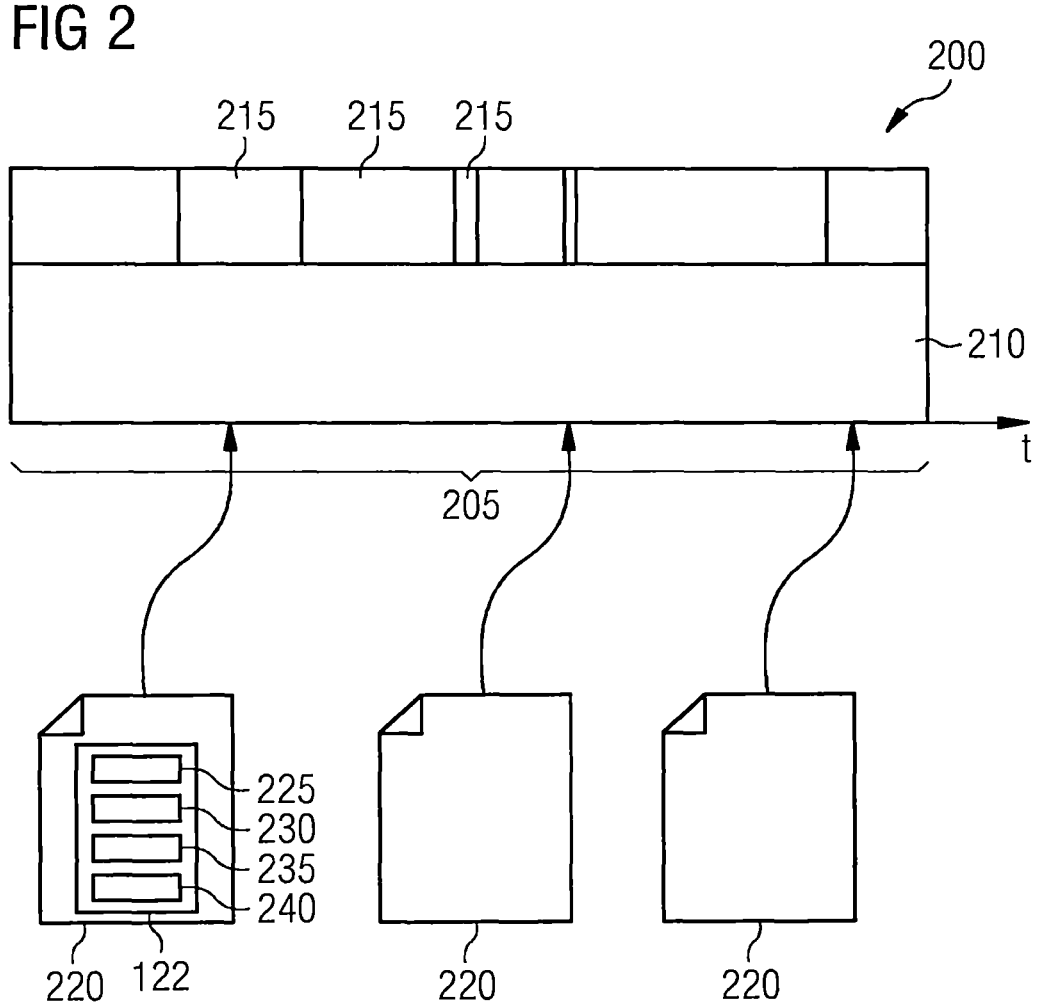

METHOD AND SYSTEM FOR POPULATING PRINTED CIRCUIT BOARDS

CROSS-REFERENCE TO RELATED APPLICATIONS

This application claims priority to PCT Application No. PCT/EP2015/076795, having a filing date of Nov. 17, 2015, based off of German application No. DE 102015200414.7 having a filing date of Jan. 14, 2015, the entire contents of which are hereby incorporated by reference.

FIELD OF TECHNOLOGY

The following relates to a method and a system for populating printed circuit boards. This presupposes a pick-and-place system having a plurality of pick-and-place lines each set up to populate a printed circuit board with components.

BACKGROUND

An electronic assembly comprises a printed circuit board and components which are mechanically and electrically fastened on the latter. In order to produce the finished printed circuit board, the components are placed on the printed circuit board by means of a pick-and-place machine and are then soldered to the printed circuit board in a reflow oven. A plurality of pick-and-place machines can be run through in succession within a pick-and-place line. In order to produce a large number of printed circuit boards, it is possible to use a pick-and-place system which comprises a plurality of pick-and-place lines.

The pick-and-place machine can be equipped only with a predetermined number of different component types. A composition of component types on the pick-and-place machine is called a set-up. A set-up makes it possible to produce only a limited number of different printed circuit boards. However, the intention is usually to produce printed circuit boards of more different printed circuit board types than is possible by means of one set-up, with the result that the set-up has to be changed during production.

Although modification, that is to say an operation of exchanging a set-up on a pick-and-place machine for another set-up, is not a particularly complicated operation, exchangeable set-up tables (shuttle tables) which are costly and whose previous population with components of predetermined component types may be time-consuming and labor-intensive are used for this purpose.

The aim is therefore usually to provide at least one fixed set-up and as few variable set-ups as possible. In this case, the assignment of component types to the fixed set-up usually remains constant in a predetermined planning horizon which may be approximately 6 to 12 months, for example. Variable set-ups usually remain unchanged in their composition of component types for a very much shorter time, for example approximately 1 to 5 days.

For a given set of printed circuit boards of different printed circuit board types which are intended to be populated by means of a pick-and-place line, an attempt is usually made to determine a fixed set-up which makes it possible to populate as many printed circuit boards or printed circuit board types as possible.

DE 10 2012 220 904 A1 relates to a method for determining a fixed set-up which is as advantageous as possible for a pick-and-place line. However, this method does not take into account the fact that a plurality of pick-and-place lines of a pick-and-place system should ideally be matched to one another in terms of their assigned printed circuit board types in order to make the parallel production of printed circuit boards of different printed circuit board types as efficient as possible. When applying the method to a plurality of pick-and-place lines of a pick-and-place system in succession, the result may therefore be a disadvantageous distribution which leaves part of the capacity of the system unused.

EP 0 478 360 A1 relates to the distribution of work on a production line when populating printed circuit boards.

DE 10 2011 076 565 A1 proposes a method for assigning printed circuit boards on pick-and-place lines for populating the printed circuit boards with components.

SUMMARY

WO 2014/005 744 A1 shows a technique for assigning printed circuit boards on pick-and-place lines. An aspect relates to specifying an improved method, a computer program product and a system for populating printed circuit boards, allowing more efficient population on a pick-and-place system having a plurality of pick-and-place lines.

In order to populate printed circuit boards on a pick-and-place system having a plurality of pick-and-place lines, set-up families with associated set-ups are provided, a number of printed circuit board types being assigned to each set-up family and a number of component types being assigned to each associated set-up, with the result that a printed circuit board of a printed circuit board type in a set-up family can be populated by means of components of the component types in the set-up on a pick-and-place line. Stocks of components of the component types in a set-up can be provided by means of set-up tables on the pick-and-place line. In this case, a set-up table of a variant set-up is used only once and a set-up table of a fixed set-up is used repeatedly on a pick-and-place line.

For populating a predetermined set of printed circuit board types, the variant set-up is implemented on one or more set-up tables by equipping the set-up tables with stocks of required components. The variant set-up is then fitted to a pick-and-place line, the printed circuit boards are populated and the variant set-up is removed from the pick-and-place line again. The variant set-up is then removed or modified. A further use of the variant set-up, that is to say of the set-up tables in the same configuration, is not provided.

The fixed set-up is implemented in the same manner on one or more set-up tables and is fitted to a pick-and-place line in order to populate predetermined printed circuit board types. However, after the end of this population, the fixed set-up is not removed, but rather is kept ready in order to be used again in the same configuration on a pick-and-place line. A fixed set-up is usually not changed within a planning horizon which may be approximately 6 to 12 months, for example. The fixed set-up can be used very frequently on one pick-and-place line or on changing pick-and-place lines within this time. One or more variant set-ups or fixed set-ups can be fitted to a pick-and-place line between two uses of the same fixed set-up.

A method for populating printed circuit boards comprises steps of detecting orders each for populating a quantity of printed circuit boards of a printed circuit board type with components of predetermined component types, assigning printed circuit board types of the detected orders to a predetermined number of fixed set-up families, optimizing the assignment in such a manner that a characteristic number based on all pick-and-place lines of the pick-and-place system is optimized as far as possible, and populating the printed circuit boards on one of the pick-and-place lines using one of the determined fixed set-ups.

This optimization of the assignment of printed circuit boards to pick-and-place lines makes it possible to utilize the pick-and-place system in an improved manner. As a result of the fact that the characteristic number assigned to the overall pick-and-place system is considered, the total productivity can be more important than the balanced operation of the pick-and-place lines. Irregularities in the utilization may be compensated for later when forming variant set-ups. The pick-and-place system can be utilized in an improved manner and the productivity of the pick-and-place system can be increased. Cost advantages for the operator of the pick-and-place system or for a client may result therefrom.

In this case, the characteristic number may comprise a population time for the printed circuit boards whose orders can be processed using the fixed set-ups. In this case, the characteristic number can be called the production time. In the sense of optimization, the production time can be maximized as far as possible in order to determine the fixed set-ups such that they can be used to populate as many printed circuit boards—of the same or different printed circuit board types—as possible. A downtime in which the pick-and-place line does not operate can be minimized.

The characteristic number may also comprise a number of orders which can be processed using the determined fixed set-up. The greater the number of orders, the more productively the pick-and-place system can be operated.

In one particularly preferred embodiment, the characteristic number comprises a number of orders to be produced for each printed circuit board type assigned to a pick-and-place line. In this case, the characteristic number is also called the order number. Investigations have shown that the elements of the pick-and-place system can be utilized in an improved manner by means of optimization to the order number.

It is particularly preferred for the assignment to be carried out by means of mixed integer programming. Mixed integer programming is a global optimization approach which can be easily extended and for which commercial solution methods or solution apparatuses are available. Mixed integer programming can be used to find global maxima in a multiplicity of possible solutions, with the result that particularly good optimization can be found. Available methods or apparatuses for mixed integer programming are being continuously improved, with the result that it can be expected that even better optimization results will be able to be achieved in future.

In mixed integer programming, it is advantageously respectively known for a particular assignment how high the assignment quality is in comparison with a maximum achievable assignment quality. A difference between these two characteristic numbers is also called a "gap". As a result, it is preferably possible to abort the optimization when a predetermined assignment quality has been reached or when the gap is sufficiently small. Alternatively or additionally, the optimization can be aborted when an assignment whose assignment quality satisfies the predefined criteria cannot be found during a predetermined processing time. As a result, it is possible to prevent an assignment quality which is selected to be too high or a gap which is selected to be too small from preventing the determination of an assignment in an appropriate time.

The assignment is preferably determined in such a manner that printed circuit boards which cannot be populated using the determined fixed set-up are populated using a variant set-up within a predetermined production time.

The stated method generally determines only set-ups which can be used, in particular, as fixed set-ups. However, it is preferred for the above-mentioned assignment to be determined or optimized in such a manner that printed circuit boards which cannot be populated using the determined set-up can be populated using another set-up within a predetermined production time. This other set-up may comprise a variant set-up, in particular.

In other words, the method assigns the printed circuit board types to a fixed set-up portion or a variable set-up portion, in which case it is ensured that the printed circuit boards of the variable set-up portion can also be populated within the predetermined production time. It is therefore possible to ensure that the fixed set-up is not determined in such a manner that a time requirement associated with the remaining variable set-up portion affects the advantages of the fixed set-up.

In one embodiment, subsets of the printed circuit boards of a printed circuit board type may be allocated to different pick-and-place lines. If the intention is to populate a particularly large quantity of printed circuit boards of a printed circuit board type, for example, a plurality of pick-and-place lines can perform parts of this order in a parallel manner or in succession.

The assignment is preferably carried out in such a manner that a space used by the component types, which are assigned to a pick-and-place line within the scope of the determined fixed set-up, requires only a predetermined portion of an available space. This space is usually expressed in tracks, a track being able to have a width of 8 mm, for example. A set-up table comprises 40 tracks, for example, and a pick-and-place machine provides space for two set-up tables. In this example, the total available space is 640 mm, in which case the boundaries of the set-up tables have to be taken into account. It may be required, for example, for the determined set-up to occupy no more than approximately 90% of this space (no more than 36 tracks in the above example).

A computer program product comprises program code means for carrying out the described method when it runs on a processing device or is stored on a computer-readable medium. The processing device may comprise a programmable microcomputer, in particular.

A pick-and-place system for populating printed circuit boards comprises a plurality of pick-and-place lines and a processing device which is set up to carry out the method described above in order to populate printed circuit boards on one of the pick-and-place lines using one of the determined fixed set-ups.

BRIEF DESCRIPTION

Some of the embodiments will be described in detail, with references to the following figures, wherein like designations denote like members, wherein:

FIG. 1 shows a pick-and-place system, in accordance with embodiments of the present invention; and FIG. 2 shows an illustration of set-up families on a pick-and-place line from FIG. 1, in accordance with embodiments of the present invention.

DETAILED DESCRIPTION

FIG. 1 shows an exemplary pick-and-place system 100. The pick-and-place system 100 comprises one or more pick-and-place lines 110 and a processing or control device 115. Each pick-and-place line 110 comprises an optional transport system 125 and one or more pick-and-place machines 130. Each pick-and-place machine 130 comprises one or more pick-and-place heads 135 which are each set up to pick up components 155 from a set-up table 140 and to position them at a predetermined position on the printed circuit board 120 which is situated on the transport system 125. During the population operation, the printed circuit board 120 is usually stationary with respect to the pick-and-place machine 130.

The set-up tables 140 each comprise a multiplicity of supply devices 150, only one of which is illustrated by way of example in FIG. 1. Each supply device 150 holds a stock of components 155 of a predetermined component type 160. For the components 155, the supply device 150 usually has a capacity which can be expressed in tracks. A track usually has a width of 8 mm and the number of tracks of a set-up table 140 is restricted, for example to 40. Components 155 of the same component type 160 are usually provided in a belt, on a tray or in a tube. Each component type 160 requires a predetermined number of tracks, which are usually adjacent to one another, on the supply device 150 and on the set-up table 140.

A supply device 150 can usually be configured to hold components 155 of different component types 160, and different supply devices 150 can usually be fitted to a set-up table 140. In the present case, it is assumed, for the purpose of simplification, that a stock of components 155 of a component type 160 on a supply device 150 is virtually infinite, that is to say there is no need for restocking.

If a component 155 of a component type 160, which is not present on one of the set-up tables 140, is required on the pick-and-place machine 130, the assignment of components 155 on one of the fitted set-up tables 140 is usually not changed, but rather the set-up table 140 is completely exchanged for another, appropriately furnished, set-up table 140. The operation of furnishing a set-up table 140, which is not fitted to the pick-and-place line 110, with components 155 is called preliminary setting-up and can require a processing time in the region of one or more hours, for example approximately 6-10 hours.

Since a change of set-up tables 140 on the pick-and-place line 110, a so-called set-up change, is usually associated with a production standstill, the aim is to change the set-up tables 140 as rarely as possible. Since the set-up tables 140 are also costly and the process of modifying a set-up table 140 can be complicated and lengthy, an attempt is also made to form as few set-ups as possible in order to produce a predetermined production volume of printed circuit boards 120 of predetermined printed circuit board types 122. In this case, the production volume comprises a plurality of printed circuit board types 122, a predetermined quantity of printed circuit boards 120 of which is respectively intended to be populated with components 155 of predetermined component types 160. For example, 300 printed circuit boards 120 of a first printed circuit board type 122 and 200 printed circuit boards 120 of a second printed circuit board type 122 can be populated.

A set-up 165, 170 comprises a set of component types 160 and is implemented by means of one or more set-up tables 140 which are equipped with stocks of components 155 of the component types 160 in the set-up 165, 170 and are fitted to the pick-and-place line 110.

The set-up 165, 170 is assigned a set-up family 175 which comprises printed circuit board types 122, printed circuit boards 120 of which can be populated by means of components 155 of the component types 160 in the set-up 165, 170. A set-up family 175 is assigned to precisely one set-up 165, 170 and vice versa.

In order to increase the utilization of a pick-and-place line 110 or to reduce a need for set-up tables 140, it is therefore decisive how set-up families 175 are formed on the basis of the printed circuit board types 122 to be populated. Secondary conditions need to be heeded when forming set-ups 165, 170 or set-up families 175, for example the compliance with a limited capacity of a set-up table 140 for component types 160 or a grouping of predetermined printed circuit board types 160 in the same set-up family 175, for instance for reasons of using leaded or unleaded soldering tin.

The set-ups may be distinguished as fixed set-ups 165 and variant set-ups 170.

A variant set-up 170 is usually set up only for single use on a pick-and-place line 110. If a population operation using a variant set-up 170 is concluded, the associated set-up table(s) 140 is/are removed from the pick-and-place line and its/their configurations are changed in order to implement another fixed or variant set-up 170. A variant set-up 165 usually remains implemented on set-up tables 140 for no longer than a few hours or days, but at least usually no longer than a week.

In contrast, a fixed set-up 165 can be used repeatedly. Between uses of a fixed set-up 165, the set-up tables 140 assigned to it are usually stored temporarily without change, while the production continues on the pick-and-place line 110 using other set-up tables 140. The other set-up tables 140 may belong, in particular, to another fixed set-up 165 or to a variant set-up 170. The set-up tables 140 of the temporarily stored fixed set-up 165 can be subsequently fitted to the pick-and-place line 110 again. A fixed set-up 170 usually remains implemented on one or more set-up tables 140 without change over a predetermined planning horizon, the planning horizon being able to be 6 to 12 months, for example.

The set-ups 165, 170 can be exchanged as required on the pick-and-place line 110. In order to implement a fixed set-up 165 or a variant set-up 170, a set-up table 140 is usually set up with stocks of components 155 of predetermined component types 160 while it is not fitted to the pick-and-place line 110. Components 155 which have already been set up of component types 160 which are not required can be removed beforehand. This modification may comprise a considerable portion of manual work and may be time-consuming.

In order to minimize the effort associated with a variant set-up 170, an attempt is made to accommodate as many printed circuit board types 122 as possible in the fixed set-ups 165. However, a desired case without variant set-ups 170 can scarcely be achieved in practice.

FIG. 2 shows an illustration of exemplary set-up families 175 on a pick-and-place line 110 from FIG. 1. In this case, the set-up families 175 are distinguished as a fixed set-up family 210, which is assigned to a fixed set-up 165, and a variant production set-up family 215, which is assigned to a variant set-up 170. Within a planning horizon 205, printed circuit board types 122 in a single fixed set-up family 210 or in a single variant production set-up family 215 can be populated on the pick-and-place line 110 in the example illustrated.

It is assumed that, at the beginning of the planning horizon 205, there are a plurality of orders 220 which need to be executed as efficiently as possible. The number of orders is called the order number. Each order 220 comprises at least one printed circuit board type 122 and a quantity 225 of printed circuit boards 120 to be populated. The printed circuit board type 122 is assigned component types 160, components 155 of which are to be populated on the individual printed circuit boards 120.

A printed circuit board type 122 may be assigned further information. For example, a number 230 of component types 160 which are intended to be populated on each printed circuit board 120, a number 235 of populating positions of a printed circuit board 120 or a production time 240 for a printed circuit board 120 of the respective printed circuit board type 122 may be stated. The number of populating positions corresponds to the number of components 155 to be populated on a printed circuit board 120 of the printed circuit board type 122, irrespective of the component type 160. It is also possible to state an order number 245 which indicates how many orders 220 for populating printed circuit boards 120 of a printed circuit board type 122 are present in a predetermined planning horizon 205.

The use of mathematical methods makes it possible to achieve considerably better solutions for the assignment of printed circuit board types 122 to fixed set-up families 210 or to pick-and-place lines 110 than with procedures previously used in practice.

In order to determine an optimized assignment of printed circuit board types 122 to a fixed set-up family 210, it is possible to use automatic optimization. Different optimization methods can be used in this case, for example on the basis of local search methods or meta-heuristic algorithms.

However, an IP model (integer programming or integer program or mixed integer optimization model) is preferably used. One of the main methods in the field of mathematical optimization is linear optimization which deals with optimizing linear target functions over a set which is restricted by linear equations and inequations. Linear optimization is the basis of the solution methods of (mixed) integer linear optimization.

Advantages of Linear Optimization:
Global optimization approach
Easily extendable
Very good commercial standard solvers (Ilog, Gurobi, Xpress) which are widespread and tried and tested in practice
For a determined solution, it is known how far away it is at most from the optimum solution (gap).

Examples of IP formulations for optimizing the described assignment of printed circuit board types 122 to fixed set-up families 165 are given below.

Indices
L Set of the pick-and-place lines
C Set of the component types
$R_l$ Set of the printed circuit boards which can be populated on the pick-and-place line l
$R_c$ Set of the printed circuit boards with component type c
$F_l$ Set of the fixed set-up families of the pick-and-place line l Parameters
$Width_{c,l}$ Space used by a component type c on the pick-and-place line l
$Cap_{c,l}$ Capacity of the line l
$Order_r$ Quantity of orders for the printed circuit board r
$Time_{r,l}$ Production time of the assembly type r on the pick-and-place line l
$TimeLimit_l$ Maximum total production time of the line l Binary Variables
$Assign_{r,l,f}$ has the value 1 if an assembly r on the line l is in the fixed set-up family r, otherwise has the value 0.

$AssignVar_{r,l}$ has the value 1 is an assembly r is assigned to the non-fixed set-up portion on the line l, otherwise has the value 0.

$Setup_{c,l,f}$ has the value 1 if the component type c must be set up on the pick-and-place line l in the fixed set-up family f, otherwise has the value 0.

IP Formulation

The optimization can be carried out with respect to the quantity 225 of orders 220 for populating printed circuit boards 120 of particular printed circuit board types 122:

$$\text{maximize} \sum_{r \in R} \sum_{l \in L} \sum_{f \in F_l} Order_r Assign_{r,l,f}$$

In another embodiment, the optimization can also be carried out with respect to the production time:

$$\text{maximize} \sum_{r \in R} \sum_{l \in L} \sum_{f \in F_l} Time_r Assign_{r,l,f}$$

Other target optimization criteria are likewise possible. One or more of the following boundary conditions usually need to be complied with during the assignment or its optimization:

$$\sum_{l \in L} \sum_{f \in F_l} Assign_{r,l,f} + \sum_{l \in L} AssignVar_{r,l,f} = 1 \quad r \in R \quad (1)$$

$$\sum_{r \in R_c} Assign_{r,l,f} \leq |R_c| Setup_{c,l,f} \quad c \in C; l \in L; f \in F_l \quad (2)$$

$$\sum_{c \in C} Width_{c,l} Setup_{c,l,f} \leq Cap_l \quad l \in L; f \in F_l \quad (3)$$

$$\sum_{r \in R} \sum_{f \in F_l} Time_{r,l} Assign_{r,l,f} + \quad (4)$$
$$\sum_{r \in R} Time_{r,l} AssignVar_{r,l} \leq TimeLimit_l \quad l \in L$$

$$Assign_{r,l,f} = 0 \quad l \in L; f \in F_l; r \in R \setminus R_l \quad (5)$$

$$AssignVar_{r,l} = 0 \quad l \in L; r \in R \setminus R_l \quad (6)$$

$$Setup_{c,l,f} \in \{0, 1\} \quad c \in C; l \in L; f \in F_l$$

$$Assign_{r,l,f} \in \{0, 1\} \quad c \in C; l \in L; f \in F_l$$

$$AssignVar_{r,l} \in \{0, 1\} \quad c \in C; l \in L$$

The following explanations apply to these conditions:

Re (1): Each printed circuit board type must be allocated either to a fixed set-up or to the variable set-up portion of a pick-and-place line.

Re (2): A component type must be held in a fixed set-up f if at least one printed circuit board type, to which this component type is allocated, is allocated to this fixed set-up.

Re (3): The component types in a fixed set-up must fit into a set-up, that is to say the space used (tracks used) by these component types must not exceed the line capacity.

Re (4): The sum of the population times of the printed circuit boards allocated to a pick-and-place line must not exceed a predetermined production time limit for the pick-and-place line.

Re (5), (6): The pick-and-place lines can only be allocated printed circuit boards which are also permissible there.

Alternative or additional conditions may also be specified. For example, it may be required that a subset of the printed circuit board types 122 must be assigned to the same set-up family 210, 215, for example in order to respectively populate a front side and a rear side of the assigned printed circuit boards 120.

An assignment of printed circuit board types 122 to pick-and-place lines 110 corresponds to an assignment of printed circuit board types 122 to a set-up family 210, 215 since the set-up family 210, 215 predefines which printed circuit board types 160 can be populated on a pick-and-place line 110. The printed circuit board types included in a set-up family 210, 215 may be completely populated with components 155 of precisely those component types 160 which can be found in the set-up 165, 170 assigned to the set-up family 210, 215.

The assignment or optimization which is stated above and is preferably carried out by means of mixed integer optimization preferably indicates, as the result, only the assignment of printed circuit board types 160 to a set-up 165, 170. It is preferred for this set-up to be a fixed set-up 165. The printed circuit board types 160 which cannot be completely populated using the determined set-up 165, 170 are assigned to a variable set-up portion. These printed circuit board types 160 can be assigned to variant set-ups in a separate method.

After the determination of the fixed set-up 165 or the assignment of quantities 225 of printed circuit boards 155 to pick-and-place lines 110 has been concluded, the population operation can be carried out. The population operation is usually carried out in such a manner that the components 155 are individually fixed to the printed circuit boards 120 by means of solder paste. The populated printed circuit boards 155 can then be completed in a reflow oven by temporarily melting the solder paste, with the result that the components 155 are electrically and mechanically connected to conductor tracks on the surface of the printed circuit board 120.

Although the invention has been described and illustrated more specifically in detail by means of the preferred exemplary embodiment, the invention is not restricted by the disclosed examples and other variations can be derived therefrom by a person skilled in the art without departing from the scope of protection of the invention.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for populating printed circuit boards by a pick-and-place system having a plurality of pick-and-place lines, set-up families with associated set-ups being provided; a number of printed circuit board types being assigned to each set-up family and a number of component types being assigned to each associated set-up, with a result that a printed circuit board of a printed circuit board type in a set-up family can be populated by components of the component types in the set-up on a pick-and-place line; stocks of components of the component types in a set-up being able to be provided by set-up tables on a pick-and-place line, a fixed set-up being implemented on one or more set-up tables by equipping the set-up tables with stocks of required components; the fixed setup being fitted to a pick-and-place line, in order to populate predetermined printed circuit board types, but not being removed after an end of this population, but rather being held in order to be used again in a same configuration on the pick-and-place line; the method comprising:

detecting orders each for populating a quantity of printed circuit boards of the printed circuit board type with components of predetermined component types;

assigning the printed circuit board type of the detected orders to a predetermined number of fixed set-up families;

optimizing the assignment such that a characteristic number based on all pick-and-place lines of the pick-and-place system is maximized; and populating the printed circuit boards on one of the pick-and-place lines using one of the determined fixed set-ups, wherein the characteristic number comprises a population time for the printed circuit boards whose orders can be processed using the fixed set-ups; or a number of orders which can be processed using the determined fixed set-up; or a number of orders to be produced for each printed circuit board type assigned to a pick-and-place line;

wherein the assignment is determined such that printed circuit boards which cannot be populated using the determined fixed set-up can be populated using a variant set-up within a predetermined production time, a set-up table of a variant set-up being used only once on a pick-and-place line.

2. The method as claimed in claim 1, wherein the optimization is carried out by mixed integer programming.

3. The method as claimed in claim 1, wherein subsets of the printed circuit boards of a printed circuit board type are allocated to different pick-and-place lines.

4. The method as claimed in claim 1, wherein the assignment is carried out such that a space used by the component types, which are assigned to a pick-and-place line as part of the determined fixed set-up, requires only a predetermined portion of an available space.

5. A pick-and-place system having a plurality of pick-and-place lines for populating printed circuit boards, set-up families with associated set-ups being provided; a number of printed circuit board types being assigned to each set-up family and a number of component types being assigned to each associated set-up, with a result that a printed circuit board of a printed circuit board type in a set-up family can be populated by components of the component types in the set-up on a pick-and-place line; stocks of components of the component types in a set-up being able to be provided by set-up tables on the pick-and-place line, the system comprising:

a processing device which is set up to carry out the following steps of:

detecting orders each for populating a quantity of printed circuit boards of a printed circuit board type with components of predetermined component types;

assigning printed circuit board types of the detected orders to a predetermined number of set-up families;

optimizing the assignment such that a characteristic number based on all pick-and-place lines of the pick-and-place system is maximized; and controlling the system to populate printed circuit boards on one of the pick-and-place lines using one of the determined set-ups, wherein the characteristic number comprises a population time for the printed circuit boards whose orders can be processed using the fixed set-ups; or a number of orders which can be processed using the determined fixed set-up; or a number of orders to be produced for each printed circuit board type assigned to a pick-and-place line; wherein the assignment is determined such that printed circuit boards which cannot be populated using the determined fixed set-up can be populated using a variant set-up within a predetermined production time, a set-up table of a variant set-up being used only once on a pick-and-place line.

* * * * *